(12) United States Patent
Park et al.

(10) Patent No.: US 9,059,359 B2
(45) Date of Patent: Jun. 16, 2015

(54) PHOTO DETECTION DEVICE, PHOTO DETECTION PACKAGE INCLUDING THE PHOTO DETECTION DEVICE, AND PORTABLE DEVICE INCLUDING THE PHOTO DETECTION PACKAGE

(71) Applicant: SEOUL VIOSYS CO., LTD., Ansan-si (KR)

(72) Inventors: Ki Yon Park, Ansan-si (KR); Hwa Mok Kim, Ansan-si (KR); Young Hwan Son, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/140,086

(22) Filed: Dec. 24, 2013

(65) Prior Publication Data

US 2014/0183549 A1    Jul. 3, 2014

(30) Foreign Application Priority Data

Dec. 27, 2012   (KR) .......................... 10-2012-0155413
Jan. 21, 2013   (KR) .......................... 10-2013-0006274

(51) Int. Cl.
*H01L 29/15*   (2006.01)
*H01L 31/101*  (2006.01)
*H01L 31/0304* (2006.01)

(52) U.S. Cl.
CPC ...... *H01L 31/1013* (2013.01); *H01L 31/03044* (2013.01); *H01L 31/03046* (2013.01); *H01L 31/03048* (2013.01)

(58) Field of Classification Search
None
See application file for complete search history.

(56) References Cited

U.S. PATENT DOCUMENTS 7,638,809 B2 *  12/2009  Ohba .............................. 257/97

FOREIGN PATENT DOCUMENTS

KR   10-2007-0106214   11/2007

* cited by examiner

*Primary Examiner* — Kyoung Lee
(74) *Attorney, Agent, or Firm* — H.C. Park & Associates, PLC

(57) ABSTRACT

Exemplary embodiments of the present invention relate to a photo detection device including a substrate, a first light absorption layer disposed on the substrate, a second light absorption layer disposed in a first region on the first light absorption layer, a third light absorption layer disposed in a second region on the second light absorption layer, and a first electrode layer disposed on each of the first, the second, and the third light absorption layers.

25 Claims, 12 Drawing Sheets

PHOTO DETECTION DEVICE, PHOTO DETECTION PACKAGE INCLUDING THE PHOTO DETECTION DEVICE, AND PORTABLE DEVICE INCLUDING THE PHOTO DETECTION PACKAGE

CROSS-REFERENCE TO RELATED APPLICATIONS

This application claims priority from and the benefit of Korean Patent Application Nos. 10-2012-0155413, filed on Dec. 27, 2012, and 10-2013-0006274, Jan. 21, 2013, which are incorporated herein by reference for all purposes as if fully set forth herein.

BACKGROUND

1. Field

Exemplary embodiments of the present invention relate to a photo detection device capable of detecting light of different wavelength regions using one device by forming a plurality of different light absorption layers over a substrate, a photo detection package including the photo detection device, and a portable device including the photo detection package.

2. Discussion of the Background

Light is classified into several bands by wavelengths. For example, ultraviolet rays (UV) having a wavelength of 400 nm or less may be classified into UV-A, UV-B, and UV-C light.

The UV-A region light has a wavelength range of 320 nm to 400 nm, and 98% or more of UV-A region light of solar light may reach the surface of the earth. The UV-A region light may have an influence of darkening or ageing phenomenon on human skin.

The UV-B region light has a wavelength range of 280 nm to 320 nm, and only 2% of the UV-B region of solar light may reach the surface of the earth. The UV-B region light may have a very serious influence of skin cancer, cataracts, and a red spot phenomenon on the human body.

Most of the UV-B region light may be absorbed by the ozone layer, but the amount of UV-B region light that reaches the surface of the earth may be increased, and an area reached by UV-B region light may also be increased owing to the recent destruction of the ozone layer, which raises a serious environmental problem.

The UV-C region light has a wavelength range of 200 nm to 280 nm, and almost the entire UV-C region of solar light may be absorbed by the atmosphere and thus the UV-C region may rarely reach the surface of the earth. The UV-C may be chiefly used in a sterilization action.

A representative value of quantified influences of UV light on the human body is a UV index defined by the incident amount of UV-B region light.

In particular, devices capable of detecting UV light include a PhotoMultiplier Tube (PMT) and a semiconductor device. The semiconductor device may be commonly used because the semiconductor device may be cheaper than the PMT and the semiconductor device may also have a smaller size than the PMT. The semiconductor device may be made of gallium nitride (GaN) or silicon carbide (SiC) having a proper energy bandgap capable of detecting UV light.

In the case of a device based on GaN, a Schottky junction type device, a Metal-Semiconductor-Metal (MSM) type device, and a PIN type device may be used. In particular, the Schottky junction type device may be preferred because of its simple fabrication process.

The Schottky junction type device has a structure in which a buffer layer, a light absorption layer, and a Schottky junction layer are sequentially stacked over a heterogeneous substrate, a first electrode is formed on the buffer layer or the light absorption layer, and a second electrode is formed on the Schottky junction layer.

However, a conventional Schottky junction type device may require two or more devices for detecting different wavelength regions because it has a device characteristic that detects only a single wavelength.

Korean Patent Laid-Open Publication No. 10-2007-0106214 discloses a semiconductor light-receiving device in which a first light absorption layer, a second light absorption layer, and an electrode layer are sequentially formed over a substrate in order to detect different wavelength regions in response to an increase in the bias of the electrode layer in a single device.

In the case of the Korean Patent, however, a wavelength region of the first light absorption layer in 0-bias, and a wavelength region of the second light absorption layer may be detected when a reverse bias is applied. As the reverse bias rises, a reactivity value of the first light absorption layer may also increase.

That is, it may be difficult to detect an accurate reactivity value because the reactivity value may vary depending on a reverse bias value even in the first light absorption layer for detecting the same area. Furthermore, the reactivity value may be changed in each wavelength band when another wavelength region of the first light absorption layer is detected according to a further increase of a reverse bias.

Accordingly, there may be problems in that a reactivity value may be frequently changed by a reverse bias value and reliability of a product may be deteriorated because a reactivity value is represented as a change of a fine current.

In general, a Light-Emitting Diode (LED) is applied to recent light-emitting means. An LED may be used in many electronic products, such as digital wall clocks, wrist watches, TV, traffic lights, and display screens, and may also be used in efficient energy lighting systems, lamps, and flashlights because it consumes less thermal energy than an existing bulb. There is also disclosed an UV LED having a sterilization function by discharging UV light.

A photo detection device may have a function of detecting an amount of light. Such a photo detection device may have a function of measuring a UV index by detecting the amount of UV light.

Products to which the LED or the photo detection device has been applied, however, may not be equipped with means for checking whether or not the LED or the photo detection device operates normally.

Accordingly, there may be a problem in that reliability of a product may not be guaranteed because whether or not a UV LED emits the proper amount of UV light and whether or not a photo detection device for detecting UV light has accurately measured the amount of UV light.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a photo detection device capable of detecting different wavelength regions of two or more regions using one device, obtaining an accurate reactivity value according to a wavelength, and having high reliability by forming a plurality of light absorption layers capable of detecting different wavelength regions in the one device and forming a first electrode layer on each of the plurality of light absorption layers so that the plurality of light absorption layers can operate individually, and a photo detection package including the photo detection device.

An exemplary embodiment of the present invention also provides a photo detection package capable of a light detection function and a light dissipation function and capable of securing reliability by monitoring whether or not a photo detection device and an LED normally operate, and a portable device including the photo detection package.

Additional features of the invention will be set forth in the description which follows, and in part will be apparent from the description, or may be learned by practice of the invention.

In accordance with an exemplary embodiment of the present invention, a photo detection device includes a substrate, a first light absorption layer disposed on the substrate, a second light absorption layer disposed in a first region on the first light absorption layer, and a first electrode layer disposed on each of the first and the second light absorption layers.

The photo detection device may further include a second electrode layer disposed on the first light absorption layer and spaced apart from the first electrode layer.

In another embodiment, the photo detection device may further include a second electrode layer disposed on a second surface of the substrate, wherein the first and second light absorption layers are disposed on a first surface of the substrate opposite to the second surface.

The photo detection device may further include a third light absorption layer disposed in a second region on the second light absorption layer. The first, the second, and the third light absorption layers may have different energy bandgaps.

The photo detection device may further include a buffer layer disposed between the substrate and the first light absorption layer.

A first Schottky layer may be disposed on the first light absorption layer and spaced apart from the second light absorption layer, a second Schottky layer may be disposed on the second light absorption layer and spaced apart from the third light absorption layer, and a third Schottky layer may be disposed in a third region on the third light absorption layer.

The first electrode layer may be disposed on each of the first, the second, and the third Schottky layers.

The photo detection device may further include a first strain reduction layer disposed between the second light absorption layer and the third light absorption layer.

The photo detection device may further include a second strain reduction layer disposed between the first light absorption layer and the second light absorption layer.

The buffer layer may include a low-temperature GaN layer, and the first light absorption layer may include a high-temperature GaN layer.

The second light absorption layer may include $Al_xGa_{1-x}N$ (0<x<1), and the third light absorption layer may include $Al_yGa_{1-y}N$ (0<y<1). The second light absorption layer may include a different Al composition from the third light absorption layer.

Each of the first light absorption layer, the second light absorption layer, and the third light absorption layer may include an $Al_xGa_{1-x}N$ (0<x<y) layer, an $Al_yGa_{1-y}N$ (x<y<1) layer, or an $In_zGa_{1-z}N$ (0<z<1) layer so that the $Al_xGa_{1-x}N$ (0<x<y) layer, the $Al_yGa_{1-y}N$ (x<y<1) layer, and the $In_zGa_{1-z}N$ (0<z<1) layer included in any one of the first, the second, and the third absorption layers is not included in the remaining layers.

The first, the second, and the third Schottky layers may be made of any one of ITO, Pt, W, Ti, Pd, Ru, Cr, Au, Ni, and Cr.

The first strain reduction layer may include $Al_dIn_{1-d}N$ (0<d≤1), and the second strain reduction layer includes $Al_fIn_{1-f}N$ (0<f≤1).

In accordance with another exemplary embodiment of the present invention, a photo detection package includes a lead frame including a depression unit disposed in the top surface of the lead frame, a photo detection device disposed on the depression unit and including a plurality of light absorption layers having different energy bandgaps and first electrode layers disposed on the respective light absorption layers, and a plurality of first electrode plates spaced apart from one another, disposed on one side of the bottom surface of the depression unit, and connected to respective first electrode layers by bonding wires.

A second electrode layer spaced apart from the first electrode layers may be disposed on a light absorption layer of the plurality of light absorption layers, and a second electrode plate disposed on the other side of the bottom surface of the depression unit may be electrically connected to the second electrode layer by a bonding wire.

A device contact plate may be spaced apart from the first electrode plates and the second electrode plate and disposed between the first electrode plates and the second electrode plate, and the photo detection device may be disposed on the device contact plate.

In another embodiment, a second electrode layer may be disposed at the bottom of the photo detection device.

A second electrode plate spaced apart from the first electrode plates may be disposed on the other side of the bottom surface of the depression unit, and the photo detection device may be disposed on the second electrode plate.

Furthermore, a plurality of first lead wires electrically connected to the respective first electrode plates may be disposed on one side of the lead frame, and a second lead wire electrically connected to the second electrode plate may be disposed on the other side of the lead frame.

The photo detection device may include a substrate, a first light absorption layer disposed on the substrate, a second light absorption layer disposed in a first region on the first light absorption layer, a third light absorption layer disposed in a second region on the second light absorption layer, and a first electrode layer disposed on each of the first, the second, and the third light absorption layers.

Furthermore, a first Schottky layer may be disposed on the first light absorption layer and spaced apart from the second light absorption layer, a second Schottky layer may be disposed on the second light absorption layer and spaced apart from the third light absorption layer, and a third Schottky layer may be disposed in a third region on the third light absorption layer.

The first electrode layer may be disposed on each of the first, the second, and the third Schottky layers.

Furthermore, a buffer layer may be disposed between the substrate and the first light absorption layer.

Furthermore, a first strain reduction layer may be disposed between the second light absorption layer and the third light absorption layer.

Furthermore, a second strain reduction layer may be disposed between the first light absorption layer and the second light absorption layer.

DETAILED DESCRIPTION OF THE ILLUSTRATED EMBODIMENTS

Figure 1:
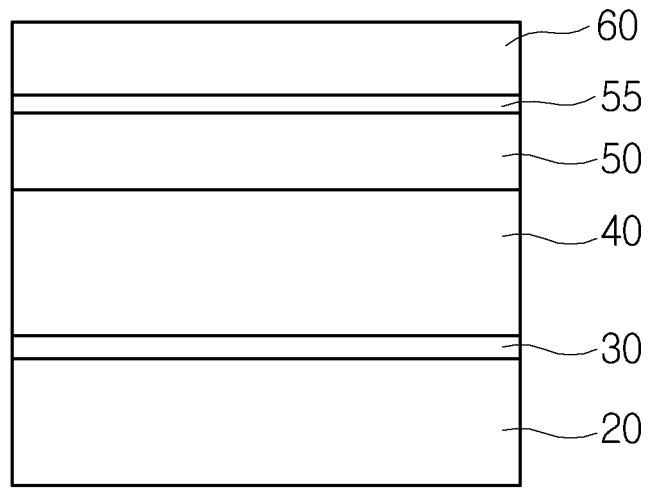
FIG. 1 is a schematic diagram of the stack structure of a photo detection device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Photo detection devices and photo detection packages including the photo detection devices in accordance with some embodiments of the present invention are described with reference to the accompanying drawings. The thickness of lines and the size of elements shown in the drawings may have been enlarged for the clarity of a description and for convenience' sake.

Furthermore, the following embodiments illustrate the detection of UV light, but the present invention may also be used to detect light having different wavelength regions in addition to the UV wavelength.

FIG. 1 is a schematic diagram of the stack structure of a photo detection device in accordance with a first exemplary embodiment of the present invention.

As shown in FIG. 1, in order to fabricate the photo detection device 10 in accordance with the first exemplary embodiment of the present invention, a buffer layer 30, a first light absorption layer 40, a second light absorption layer 50, a first strain reduction layer 55, and a third light absorption layer 60 are sequentially stacked over a substrate 20.

The substrate 20 may be made of sapphire, AlN, GaN, SiC, or Si, and the structure of the photo detection device 10 may be changed depending on a conductive substrate.

First, the substrate 20 is placed in the susceptor of a Metal Organic Chemical Vapor Deposition (MOCVD) reaction chamber. Impurity gas within the reaction chamber is removed by lowering pressure within the reaction chamber to 100 torr or less.

Thereafter, a surface of the heterogeneous substrate 20 is thermally washed by maintaining pressure within the reaction chamber to 100 torr and raising temperature to 1100° C. A low-temperature GaN layer, that is, the buffer layer 30, is grown by lowering the temperature up to 550° C. and flowing a Ga source and ammonia ($NH_3$) gas. Here, the overall flow of the gas within the reaction chamber is determined by hydrogen ($H_2$) gas.

In order to secure the crystallizability and optical and electrical characteristics of the first light absorption layer 40, that is, a high-temperature GaN layer that is grown on the buffer layer 30, that is, a low-temperature GaN layer, the buffer layer 30 may be formed to a thickness of about at least 25 nm. If the buffer layer 30 is grown as a low-temperature AlN layer, the buffer layer 30 may be grown to a thickness of about 25 nm at about 600° C.

After growing the buffer layer 30, the first light absorption layer 40, that is, a high-temperature GaN layer, is grown by raising temperature within the susceptor up to from 1000° C.

to 1100° C., for example, up to 1050° C. Optical, electrical, and crystalline characteristics may be deteriorated if the temperature is less than 1000° C. and surface roughness is increased and crystallizability may be deteriorated if the temperature exceeds 1100° C.

The thickness of the first light absorption layer 40, that is, a high-temperature GaN layer, may be about 2 μm. The first light absorption layer 40 may have an n-type characteristic although it is not doped, but may be doped with Si in order to obtain an n-type effect.

Thereafter, the second light absorption layer 50 is grown on the first light absorption layer 40. First, an $Al_xGa_{1-x}N$ layer (0<x<1) is grown by supplying an Al source under a growth condition similar to that of the first light absorption layer 40.

In growing the second light absorption layer 50, in order to use the second light absorption layer 50 as a light absorption layer for detecting a UV-B region, the second light absorption layer 50 may have an Al composition of 15% or higher. In order to increase light absorption efficiency, the second light absorption layer 50 may have a thickness of 0.1 μm~2 μm.

The third light absorption layer 60 is grown on the second light absorption layer 50. First, an $Al_yGa_{1-y}N$ layer (0<y<1) is grown by supplying an Al source under a growth condition similar to that of the first light absorption layer 40.

In growing the third light absorption layer 60, in order to use the third light absorption layer 60 as a light absorption layer for detecting an UV-C region, the third light absorption layer 60 may have an Al composition of about 40% or higher. In order to increase light absorption efficiency, the third light absorption layer 60 may have a thickness of 0.1 μm to 2 μm.

In order to reduce strain that may be generated at the interface between the second light absorption layer 50 and the third light absorption layer 60, the first strain reduction layer 55 may be formed of an $Al_dIn_{1-d}N$ (0<d≤1) layer between the second light absorption layer 50 and the third light absorption layer 60.

If the first strain reduction layer 55 is formed of a high-temperature AlN layer at a temperature of about 1050° C., the first strain reduction layer 55 may have a thin thickness of 50 nm or less because the first strain reduction layer 55 becomes close to an insulating layer due to an energy bandgap of about 6 eV, it may be difficult to obtain high-quality crystallizability, and the first strain reduction layer 55 may hinder the flow of a fine current according to crystallizability and insulating characteristics.

If the first strain reduction layer 55 is formed of $Al_dIn_{1-d}N$ (0<d<1), the first strain reduction layer 55 may be grown at a temperature of 900° C. or less in order to form a layer containing In. Here, the first strain reduction layer 55 may have a superlattice form in which a plurality of layers is repeated.

As described above, according to the present exemplary embodiment, light having different wavelength bands can be detected by forming the first light absorption layer 40, the second light absorption layer 50, and the third light absorption layer 60 having different energy bandgaps. In another exemplary embodiment, each of the first light absorption layer 40, the second light absorption layer 50, and the third light absorption layer 60 may be formed of any one of the $Al_xGa_{1-x}N$ (0<x<y) layer, the $Al_yGa_{1-y}N$ (x<y<1) layer, and the $In_zGa_{1-z}N$ (0<z<1) layer so that the $Al_xGa_{1-x}N$ (0<x<y) layer, the $Al_yGa_{1-y}N$ (x<y<1) layer, or the $In_zGa_{1-z}N$ (0<z<1) layer used in one of the first to third absorption layers is not used in the remaining layers.

That is, the three different light absorption layers may be formed of the $Al_xGa_{1-x}N$ (0<x<y) layer, the $Al_yIn_{1-y}N$ (x<y<1) layer, and the $In_zGa_{1-z}N$ (0<z<1) layer, respectively. The order of the three different light absorption layers may be selected in various ways.

Figure 2:
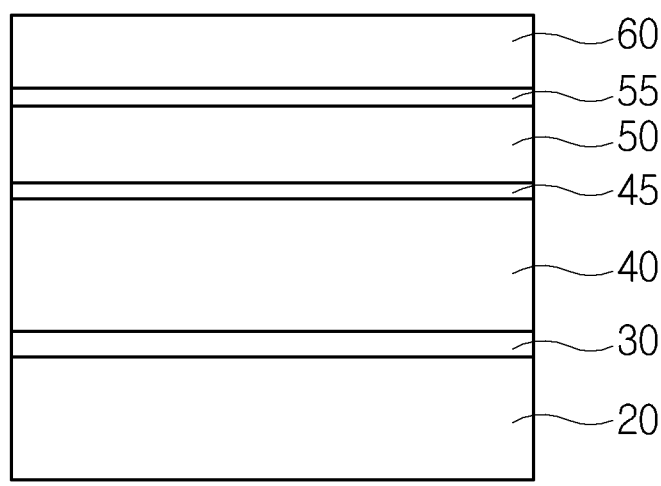
FIG. 2 is a schematic diagram of the stack structure of a photo detection device in accordance with a second exemplary embodiment of the present invention.

FIG. 2 is a schematic diagram of the stack structure of a photo detection device in accordance with a second exemplary embodiment of the present invention.

The stack structure of the photo detection device in accordance with the second exemplary embodiment is similar to that of the first exemplary embodiment described with reference to FIG. 1 except that a second strain reduction layer 45 is formed between the first light absorption layer 40 and the second light absorption layer 50.

Accordingly, the same elements as those of the first exemplary embodiment described with reference to FIG. 1 are assigned the same reference numerals, and a redundant description is omitted.

In accordance with the second exemplary embodiment of the present invention, the second strain reduction layer 45 formed of an $Al_fIn_{1-f}N$ (0<f≤1) layer is formed between the first light absorption layer 40 and the second light absorption layer 50. The second strain reduction layer 45 is formed in order to prevent the deterioration of characteristics and a reduction of yield attributable to a crack that may be generated due to lattice mismatching and a difference in the coefficient of thermal expansion between the first light absorption layer 40 formed of the high-temperature GaN layer and the second light absorption layer 50 formed of the $Al_xGa_{1-x}N$ layer (0<x<1).

In order to solve the occurrence of such a crack, the second strain reduction layer 45 formed of the $Al_fIn_{1-f}N$ (0<f≤1) layer is formed between the first light absorption layer 40 and the second light absorption layer 50.

If the second strain reduction layer 45 is formed of a high-temperature AlN layer at a temperature of about 1050° C., the second strain reduction layer 45 may have a thin thickness of 50 nm or less because the second strain reduction layer 45 becomes close to an insulating layer due to an energy bandgap of about 6 eV, it may be difficult to obtain high-quality crystallizability, and the second strain reduction layer 45 may hinder the flow of a fine current according to crystallizability and insulating characteristics.

If the second strain reduction layer 45 is formed of $Al_fIn_{1-f}N$ (0<f<1), the second strain reduction layer 45 may be grown at a temperature of 900° C. or less in order to form a layer containing In. Here, the second strain reduction layer 45 may have a superlattice form in which a plurality of layers is repeated.

Figure 3:
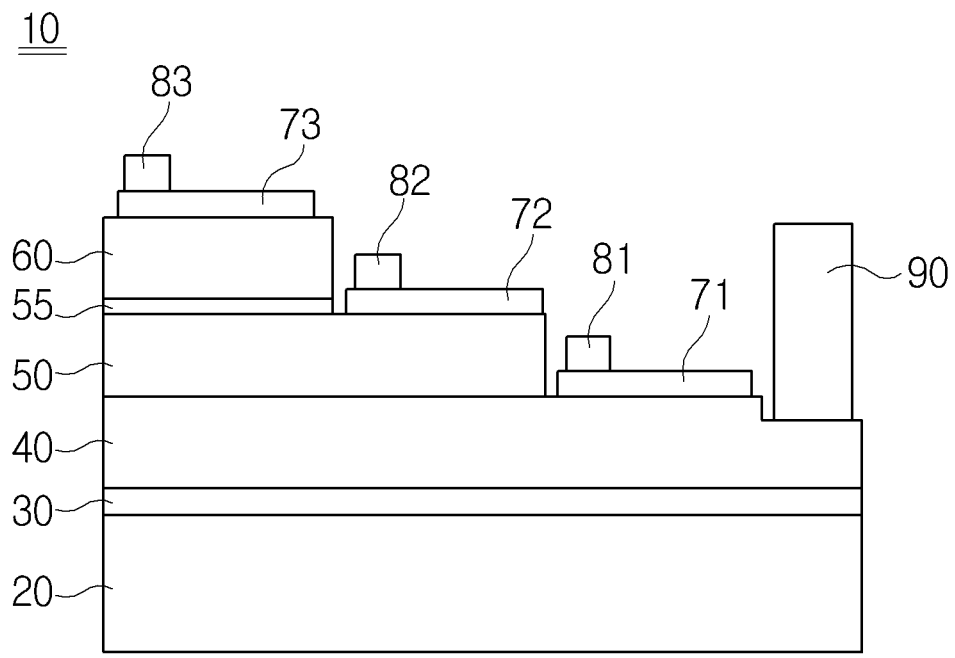
FIG. 3 is a cross-sectional view of the photo detection device in accordance with the first exemplary embodiment of the present invention.
Figure 4:
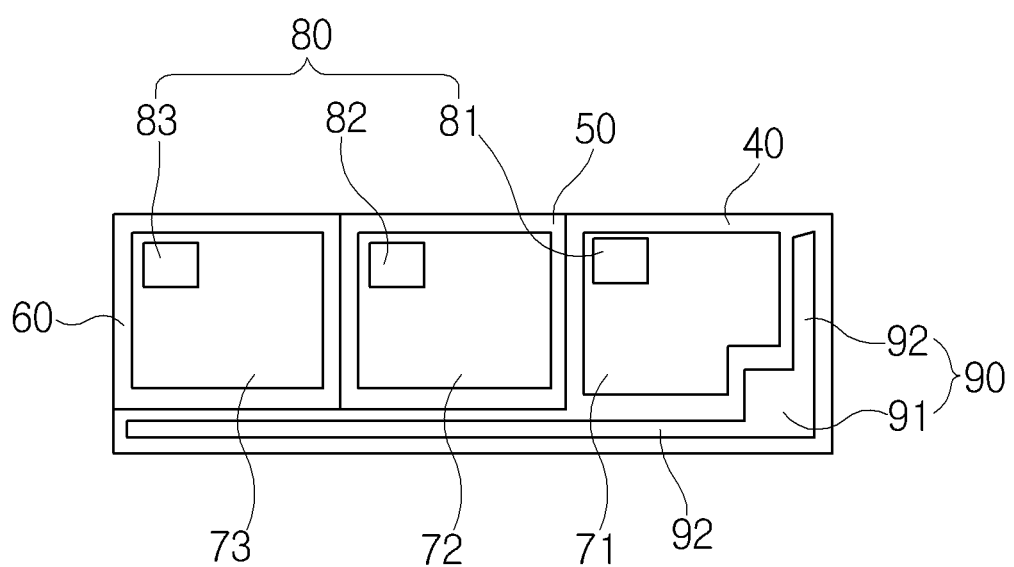
FIG. 4 is a plan view of the photo detection device in accordance with the first exemplary embodiment of the present invention.

FIG. 3 is a cross-sectional view of the photo detection device in accordance with the first exemplary embodiment of the present invention, and FIG. 4 is a plan view of the photo detection device in accordance with the first exemplary embodiment of the present invention.

In accordance with the first exemplary embodiment of the present invention, the photo detection device is configured so that a plurality of different wavelength bands can be detected in one device.

For example, in the prior art, three photo detection devices are used to detect three different types of wavelength bands in order to accurately detect reactivity. In contrast, in accordance with the first exemplary embodiment of the present invention, three different types of wavelength bands can be detected in one photo detection device.

In the present exemplary embodiment, the photo detection device capable of detecting three different wavelength bands is illustrated. However, a variety of different wavelength bands, such as 2, 4, or 5, can be detected depending on the number of stacked light absorption layers.

Furthermore, the stack structure of FIG. 1 has been applied to the present exemplary embodiment, but the stack structure of FIG. 2 may be applied instead.

Furthermore, the first light absorption layer 40, the second light absorption layer 50, and the third light absorption layer 60 are formed to have different energy bandgaps. For example, the first light absorption layer 40 may be formed of a high-temperature GaN layer, the second light absorption layer 50 may be formed of an $Al_xGa_{1-x}N$ (0<x<1) layer, and the third light absorption layer 60 may be formed of an $Al_yGa_{1-y}N$ (0<y<1) layer.

In another exemplary embodiment, each of the first light absorption layer 40, the second light absorption layer 50, and the third light absorption layer 60 may be formed of any one of the $Al_xGa_{1-x}N$ (0<x<y) layer, the $Al_yGa_{1-y}N$ (x<y<1) layer, and the $In_zGa_{1-z}N$ (0<z<1) layer in such a manner that the $Al_xGa_{1-x}N$ (0<x<y) layer, the $Al_yGa_{1-y}N$ (x<y<1) layer, or the $In_zGa_{1-z}N$ (0<z<1) layer used in any one of the first to the third absorption layers is not used in the remaining absorption layers.

That is, the three different light absorption layers may be formed of the $Al_xGa_{1-x}N$ (0<x<y) layer, the $Al_yGa_{1-y}N$ (x<y<1) layer, and the $In_zGa_{1-z}N$ (0<z<1) layer, respectively. The order of the three different light absorption layers may be selected in various ways.

First, the third light absorption layer 60, the first strain reduction layer 55, and the second light absorption layer 50 are etched by dry etching so that the second light absorption layer 50 is formed in some region on the first light absorption layer 40. A first Schottky layer 71 is formed in some region on a surface of the first light absorption layer 40 which has been exposed by the etching.

Thereafter, the third light absorption layer 60 and the first strain reduction layer 55 are etched by dry etching so that the third light absorption layer 60 is formed in some region on the second light absorption layer 50. A second Schottky layer 72 is formed in some region on a surface of the second light absorption layer 50 which has been exposed by the etching.

A third Schottky layer 73 is formed in some region on a surface of the third light absorption layer 60 which has not been etched, and a first electrode layer 80 is formed in some region on each of the first, the second, and the third Schottky layers 71, 72, and 73.

The first electrode layer 80 includes a (1-1) electrode layer 81 formed in some region on the first Schottky layer 71, a (1-2) electrode layer 82 formed in some region on the second Schottky layer 72, and a (1-3) electrode layer 83 formed in some region on the third Schottky layer 73.

Each of the first, the second, and the third Schottky layers 71, 72, and 73 may be made of any one of indium tin oxide (ITO), Pt, W, Ti, Pd, Ru, Cr, Au, Ni, and Cr and may be formed to a thickness of 10 nm or less by taking light transmittance and a Schottky characteristic into consideration.

A second electrode layer 90 is configured to have an ohmic characteristic and may be formed on the first light absorption layer 40 so that it is spaced apart from the first Schottky layer 71. For example, after etching part of the first light absorption layer 40, the second electrode layer 90 may be formed in the etched part.

The second electrode layer 90 may be formed on one side of the first Schottky layer 71 in a bar from. The second electrode layer 90 may be formed to have a wing shape so that the flow of an electric current generated from the second light absorption layer 50 and the third light absorption layer 60 is facilitated. The second electrode layer 90 includes a body unit 91 spaced apart from the first Schottky layer 71 and formed in the corner part of the first light absorption layer 40 and a pair of wing units 92 extended from the body unit 91 along the edges of the first light absorption layer 40.

If the second electrode layer 90 is formed of the body unit 91 and the pair of wing units 92 as described above, a peeling phenomenon of the second electrode layer 90 attributable to strain when wire bonding is performed can be prevented.

The first electrode layer 80 may be made of Ni/Au and formed to a thickness ranged from 200 nm to 2 μm. Furthermore, the second electrode layer 90 may be made of Cr/Ni/Au and formed to a thickness ranged from 400 nm to 2 μm. Here, the top of the second electrode layer 90 is formed to have a height almost corresponding to the top of the third light absorption layer 60.

In the photo detection device formed as described above, the light absorption layers may detect light having different wavelength bands, and the light absorption layers are configured in such a way as to operate individually.

Figure 5:
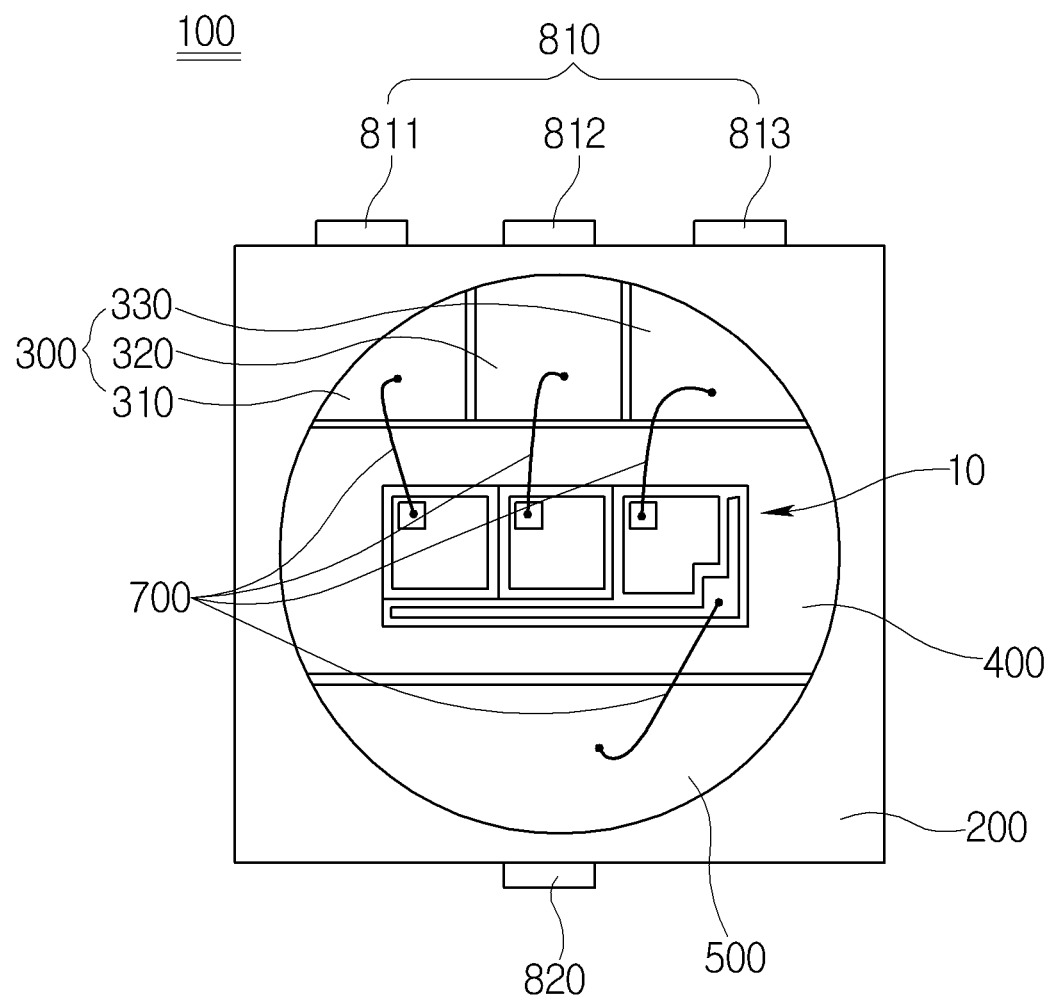
FIG. 5 is a plan view of a photo detection package in accordance with an exemplary embodiment of the present invention.
Figure 6:
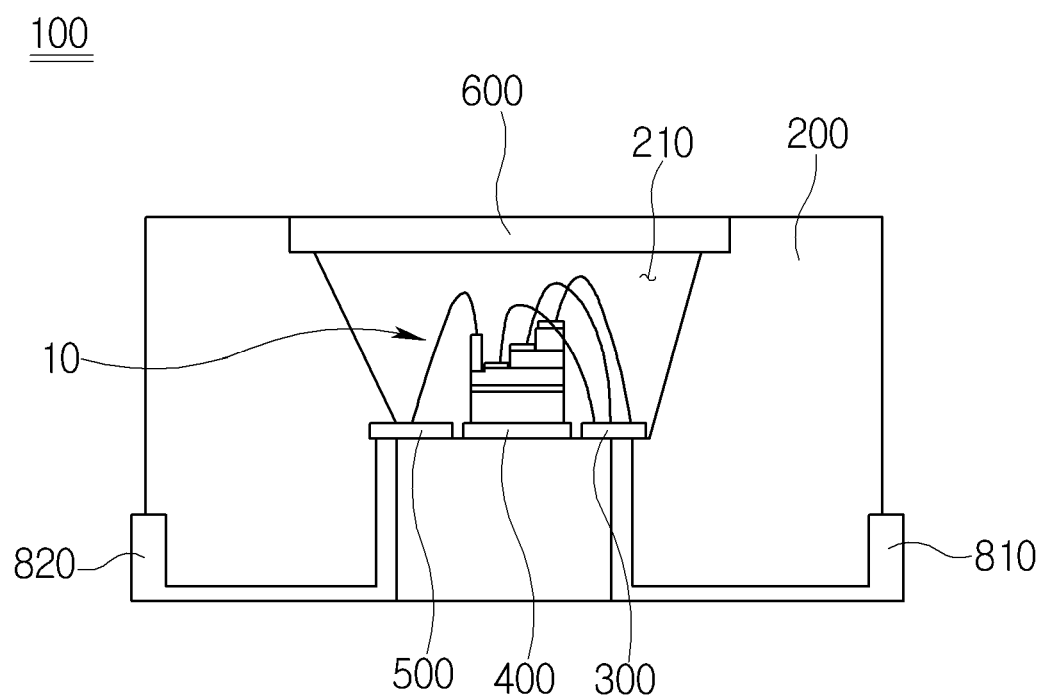
FIG. 6 is a cross-sectional view of the photo detection package in accordance with the exemplary embodiment of FIG. 5.

An example in which a photo detection package is configured using the photo detection device 10 described with reference to FIGS. 5 and 6 is described below.

FIG. 5 is a plan view of a photo detection package in accordance with the first exemplary embodiment of the present invention, and FIG. 6 is a cross-sectional view of the photo detection package in accordance with the first exemplary embodiment of the present invention.

As shown in FIGS. 5 and 6, the photo detection package 100 in accordance with the first exemplary embodiment of the present invention may include a lead frame 200 configured to have a depression unit 210 formed on its upper side, a photo detection device mounted on the depression unit 210, and a plurality of first electrode plates 300 formed on one side of the bottom surface of the depression unit 210 and spaced apart from one another.

The depression unit 210 of the lead frame 200 is closed by a window 600 in order to protect the photo detection device within the depression unit 210. The window 600 is made of transparent materials, such as quartz, sapphire, or crystal, and is seated along the upper edge of the depression unit 210.

The inner circumference surface of the depression unit 210 may be inclined by taking the reflection of light into consideration. In some embodiments, the inner circumference surface of the depression unit 210 may be formed at right angle.

Furthermore, the photo detection device mounted on the depression unit 210 of the lead frame 200 may be, for example, the photo detection device 10 described with reference to FIGS. 3 and 4. The photo detection device 10 has a structure in which a plurality of light absorption layers having different energy bandgaps are sequentially stepped and formed. The first electrode layers 80 are formed on the respective light absorption layers.

A Schottky layer is formed in some region on each of the light absorption layers, and the first electrode layer 80 is formed in some region on each of the Schottky layers.

For example, as shown in FIG. 5, the first Schottky layer 71 is formed in some region on the first light absorption layer 40, and the (1-1) electrode layer 81 is formed in some region on the first Schottky layer 71. Furthermore, the second Schottky layer 72 is formed in some region on the second light absorption layer 50, and the (1-2) electrode layer 82 is formed in some region on the second Schottky layer 72.

Furthermore, the third Schottky layer 73 is formed in some region on the third light absorption layer 60, and the (1-3) electrode layer 83 is formed in some region on the third Schottky layer 73.

The first electrode plate 300 includes a (1-1) electrode plate 310, a (1-2) electrode plate 320, and a (1-3) electrode plate 330 that are spaced apart from one another. The (1-1) electrode plate 310 is electrically connected to the (1-1) electrode layer 81 by a bonding wire 700 made of Au, for example. The (1-2) electrode plate 320 is electrically connected to the (1-2) electrode layer 82 by a bonding wire 700. The (1-3) electrode plate 330 is electrically connected to the (1-3) electrode layer 83 by a bonding wire 700.

The second electrode layer 90 having a wing form is formed on the first light absorption layer 40 and is spaced apart from the first Schottky layer 71. The second electrode layer 90 is electrically connected to a second electrode plate 500 formed on the other side of the bottom surface of the depression unit 210 by a bonding wire 700.

A device contact plate 400 is formed between the first electrode plate 300 and the second electrode plate 500 and is spaced apart from the first electrode plate 300 and the second electrode plate 500. The photo detection device 10 is mounted on the device contact plate 400.

That is, the first electrode plate 300, the second electrode plate 500, and the device contact plate 400 are disposed in such a way as to be spaced apart from one another. The photo detection device 10 is mounted on the device contact plate 400. The (1-1), the (1-2), and the (1-3) electrode layers 81, 82, and 83 of the photo detection device 10 are electrically connected to the respective (1-1), (1-2), and (1-3) electrode plates 310, 320, and 330 by the respective bonding wires 700. The second electrode layer 90 of the photo detection device 10 is electrically connected to the second electrode plate 500 by the bonding wire 700.

A plurality of first lead wires 810 electrically connected to the plurality of first electrode plates 300, respectively, protrudes from and is formed on one side of the lead frame 200 so that the plurality of first lead wires 810 is connected to external electrode lines (not shown) and individually driven. A second lead wire 820 electrically connected to the second electrode plate 500 protrudes from and is formed on the other side of the lead frame 200.

The first lead wires 810 include a (1-1) lead wire 811 electrically connected to the (1-1) electrode plate 310, a (1-2) lead wire 812 electrically connected to the (1-2) electrode plate 320, and a (1-3) lead wire 813 electrically connected to the (1-3) electrode plate 330. The (1-1), the (1-2), and the (1-3) lead wires 811, 812, and 813 are spaced apart from one another.

Accordingly, the light absorption layers can be individually driven by selectively supplying power sources to the light absorption layers through the first lead wires 810.

Figure 7A:
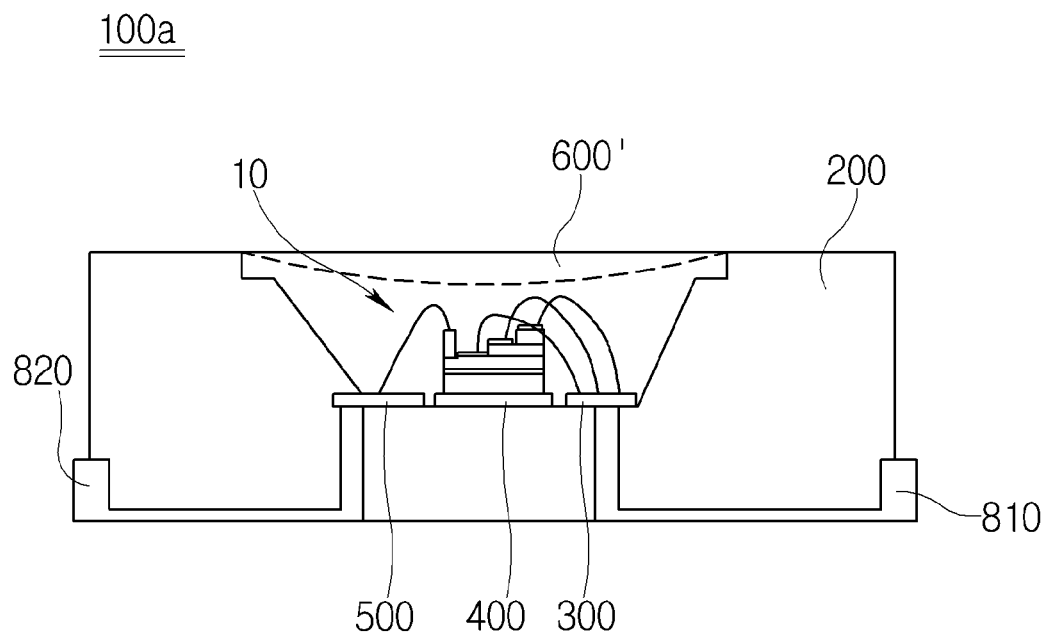
FIGS. 7A and 7B are cross-sectional views of a photo detection package in accordance with an exemplary embodiment of the present invention.
Figure 7B:
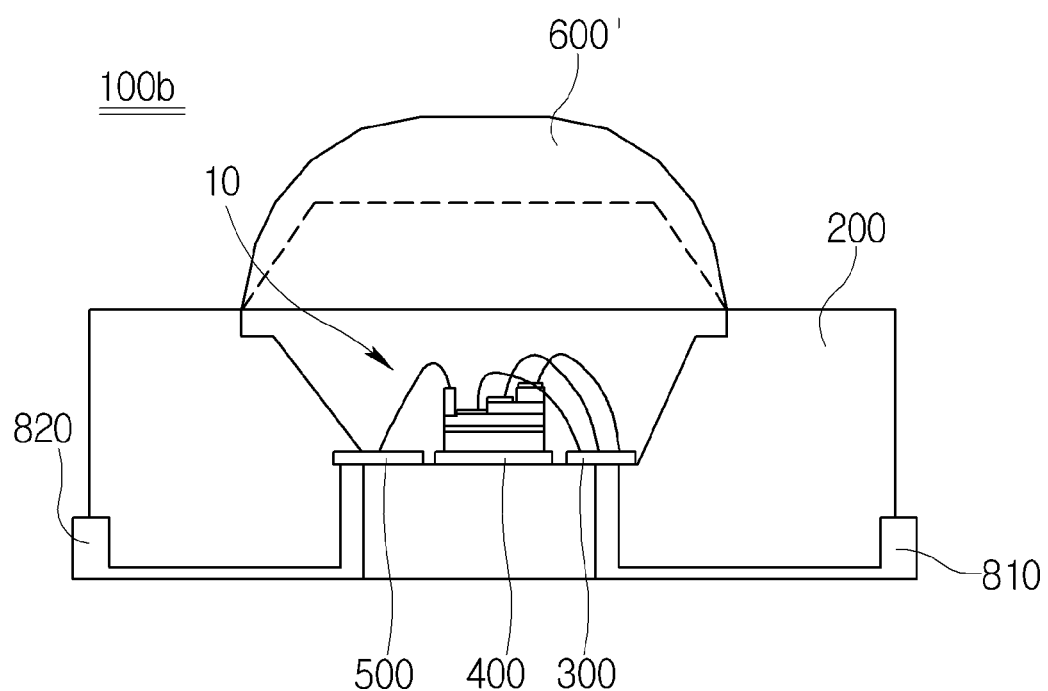

FIGS. 7A and 7B are cross-sectional views of a photo detection package in accordance with an exemplary embodiment of the present invention. The present exemplary embodiment shows an example in which the photo detection device 10 is protected by filling the depression unit 210 with epoxy resin instead of using the window of the exemplary embodiment described with reference to FIGS. 5 and 6.

Accordingly, the same elements as those of the aforementioned embodiment are assigned the same reference numerals, and a redundant description is omitted.

As shown in FIG. 7A, if a protection layer 600' is formed by filling the depression unit 210 of the photo detection package 100a with epoxy resin to be substantially flat, light may be absorbed by the Schottky layer at an angle of about 120°. If the protection layer 600' is concaved and formed as indicated by a dotted line, light absorbed at an angle of 120° or more can be detected.

Furthermore, as shown in FIG. 7B, if the protection layer 600' having a dome shape is formed in the depression unit 210 of the photo detection package 100b, light absorbed at an angle of 120° or less can be detected. The protection layer 600' may be formed in a trapezoid shape as indicated by a dotted line. That is, a wavelength at a desired angle can be detected depending on a shape of the window 600 or the protection layer 600'.

Figure 8:
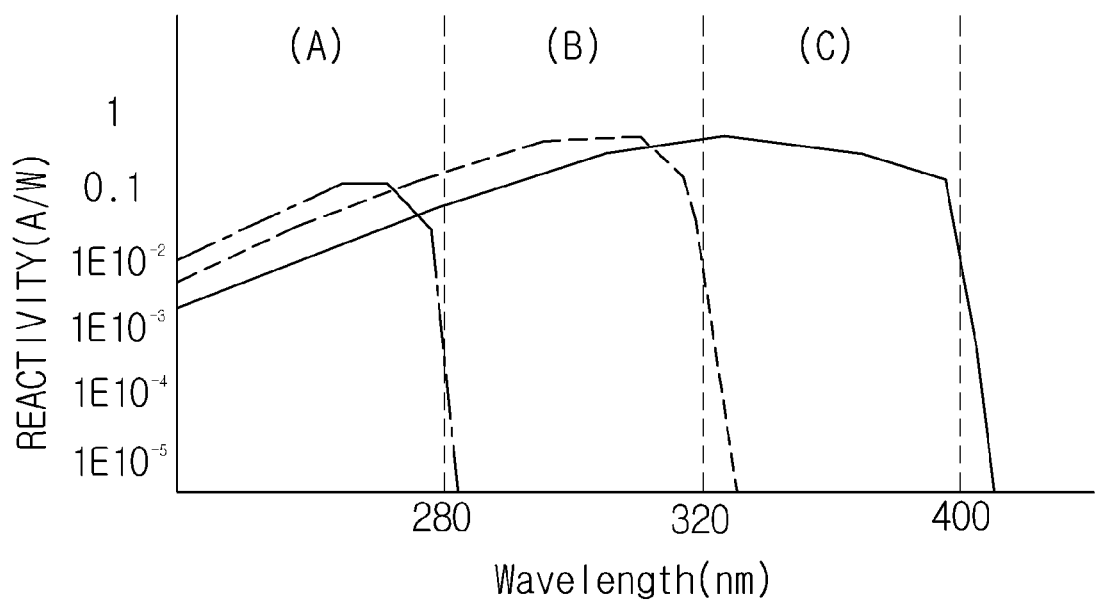
FIG. 8 is a graph showing photo reactivity measured in accordance with an exemplary embodiment of the present invention.

FIG. 8 is a graph showing that photo reactivity measured in accordance with an exemplary embodiment of the present invention. The graph shows photo reactivities measured using the photo detection device 10 in which the electrodes of different light absorption layers are separately connected and individually driven in a structure in which the different light absorption layers are included in the single device and the Schottky layers are formed on the respective light absorption layers.

In FIG. 8, reactivity of (A) shows reactivity in the third light absorption layer 60, reactivity of (B) shows reactivity in the second light absorption layer 50, and reactivity of (C) shows reactivity in the first light absorption layer 40.

That is, in the photo detection device 10 according to an exemplary embodiment of the present invention, wavelength bands to be detected in the respective light absorption layers do not need to be made sequential, and energy bandgaps that determine the absorption wavelengths of the respective light absorption layers do not need to be sequentially increased or decreased.

Figure 9:
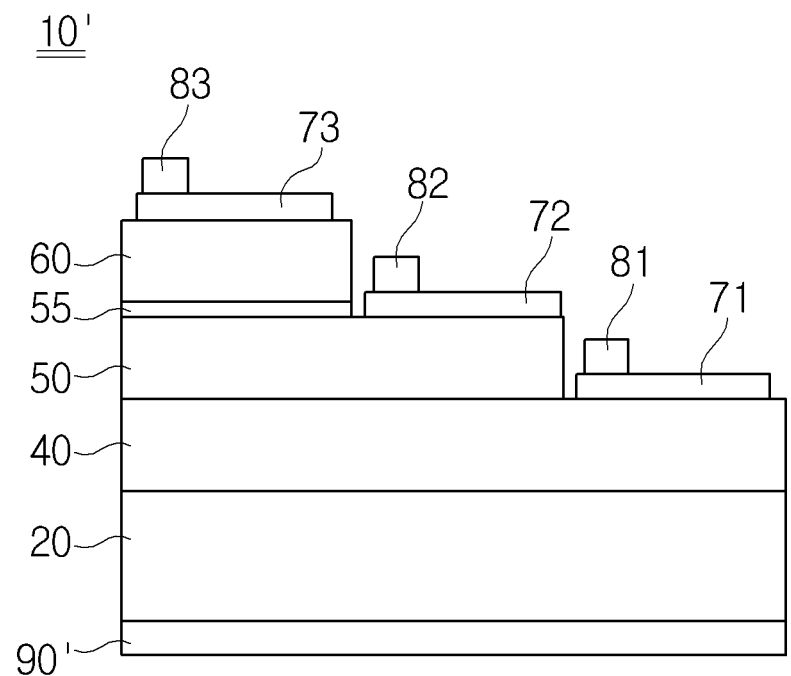
FIG. 9 is a cross-sectional view of a photo detection device in accordance with a third exemplary embodiment of the present invention.
Figure 10:
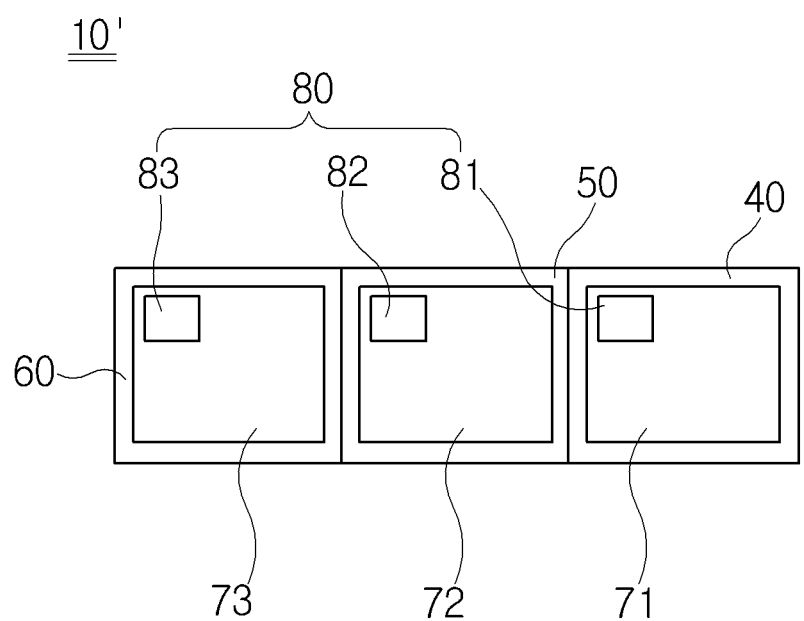
FIG. 10 is a plan view of the photo detection device in accordance with the third exemplary embodiment of the present invention.

FIG. 9 is a cross-sectional view of a photo detection device in accordance with a third exemplary embodiment of the present invention, and FIG. 10 is a plan view of the photo detection device in accordance with the third exemplary embodiment of the present invention.

The photo detection device 10' of FIGS. 9 and 10 in accordance with the third exemplary embodiment of the present invention is similar to that of the exemplary embodiment described with reference to FIGS. 3 and 4 except that a second electrode layer 90' is formed at the bottom of a conductive substrate 20' made of GaN, ZnO, SiC, or GaAs.

Accordingly, the same elements as those shown in FIGS. 3 and 4 are assigned the same reference numerals, and a redundant description is omitted.

An example in which a photo detection package is configured using the photo detection device 10' shown in FIGS. 9 and 10 is described below with reference to FIG. 11.

Figure 11:
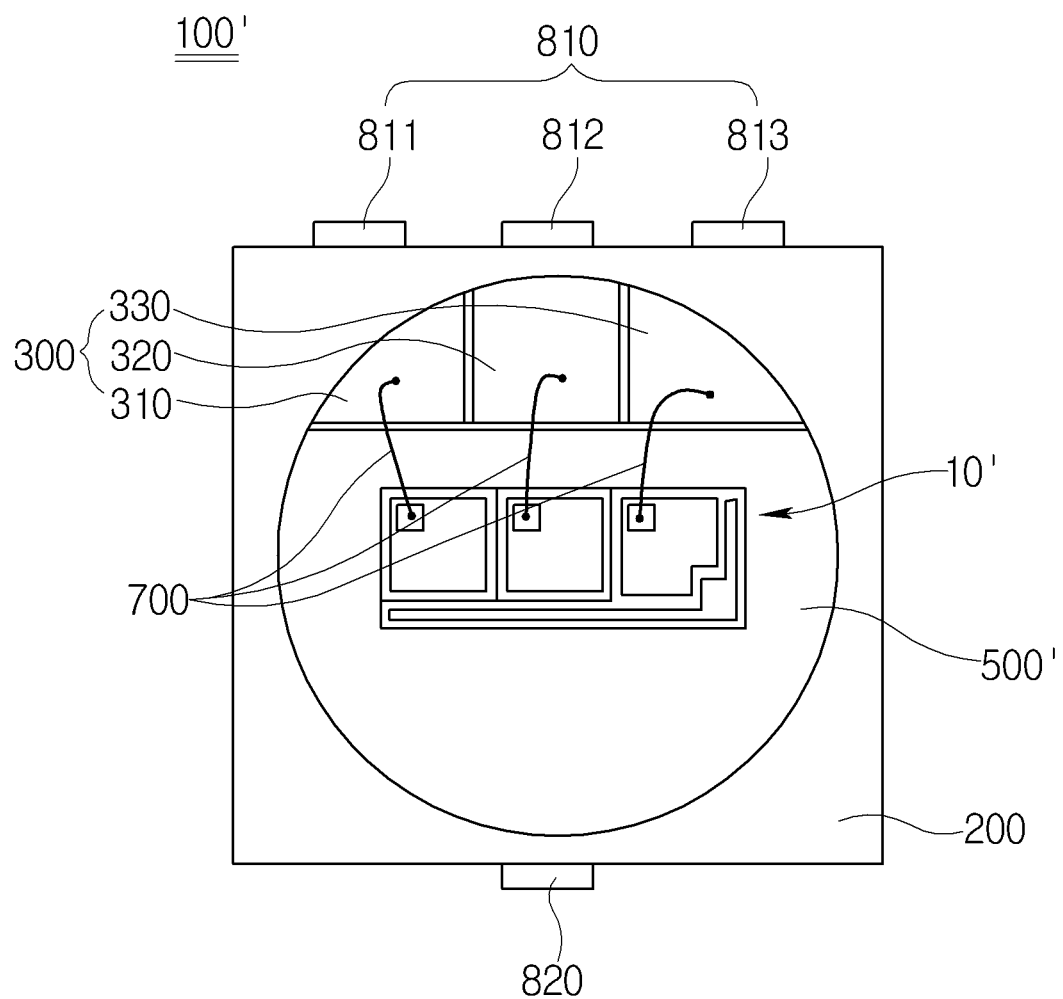
FIG. 11 is a plan view of a photo detection package in accordance with the third exemplary embodiment of the present invention.

FIG. 11 is a plan view of a photo detection package in accordance with the third exemplary embodiment of the present invention.

The photo detection package 100' of FIG. 11 in accordance with the third exemplary embodiment of the present invention is similar to that of the exemplary embodiment described with reference to FIG. 5 except that the photo detection device 10' is directly mounted on a second electrode plate 500' without the additional device contact plate 400 (refer to FIG. 5) because the second electrode layer 90' is formed at the bottom of the photo detection device 10'.

Accordingly, the same elements as those shown in FIG. 5 are assigned the same reference numerals, and a redundant description is omitted.

A plurality of first electrode plates 300 spaced apart from one another is formed on one side of the bottom surface of the depression unit 210 of a lead frame 200. The second electrode plate 500' is formed on the other side of the bottom surface of the depression unit 210 and is spaced apart from the plurality of first electrode plates 300. As shown in FIGS. 9 and 10, the photo detection device 10' in which the second electrode layer 90' is formed at the bottom of the photo detection device 10', that is, the bottom of the conductive substrate 20', is mounted on the second electrode plate 500'.

The (1-1), the (1-2), and the (1-3) electrode layers 81, 82, and 83 of the photo detection device 10' are electrically connected to the (1-1), the (1-2), and the (1-3) electrode plates 310, 320, and 330 of the first electrode plates 300, respectively, by bonding wires 700. The second electrode layer 90' of the photo detection device 10' is electrically connected to the second electrode plate 500' by contact.

Furthermore, a plurality of first lead wires 810 including (1-1), (1-2), and (1-3) lead wires 811, 812, and 813 is provided on one side of the lead frame 200 so that the plurality of first lead wires 810 is connected to external electrode lines and individually driven. A second lead wire 820 is protruded and formed on the other side of the lead frame 200.

The (1-1) lead wire 811 is electrically connected to the (1-1) electrode plate 310, the (1-2) lead wire 812 is electrically connected to the (1-2) electrode plate 320, the (1-3) lead wire 813 is electrically connected to the (1-3) electrode plate 330, and the second lead wire 820 is electrically connected to the second electrode plate 500'.

Accordingly, the light absorption layers can be individually driven by selectively supplying power to the light absorption layers through the first lead wires 810.

A photo detection package in accordance with a fourth exemplary embodiment of the present invention is described in detail below with reference to FIGS. 12 and 13.

Figure 12:
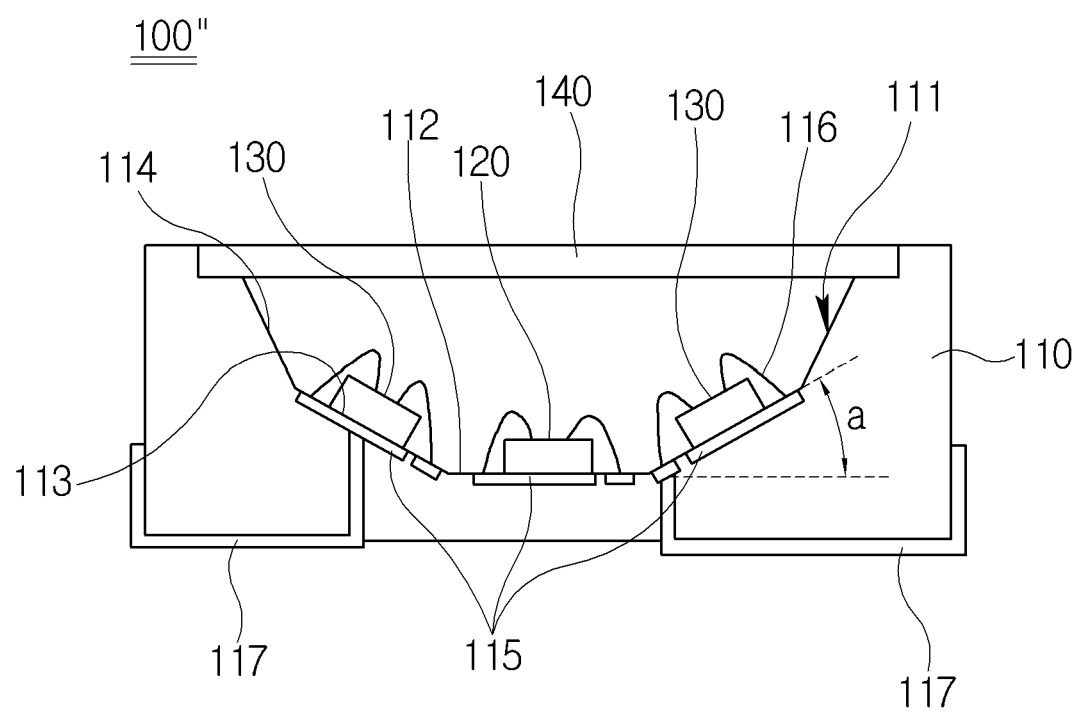
FIG. 12 is a cross-sectional view of a photo detection package in accordance with a exemplary fourth embodiment of the present invention.
Figure 13:
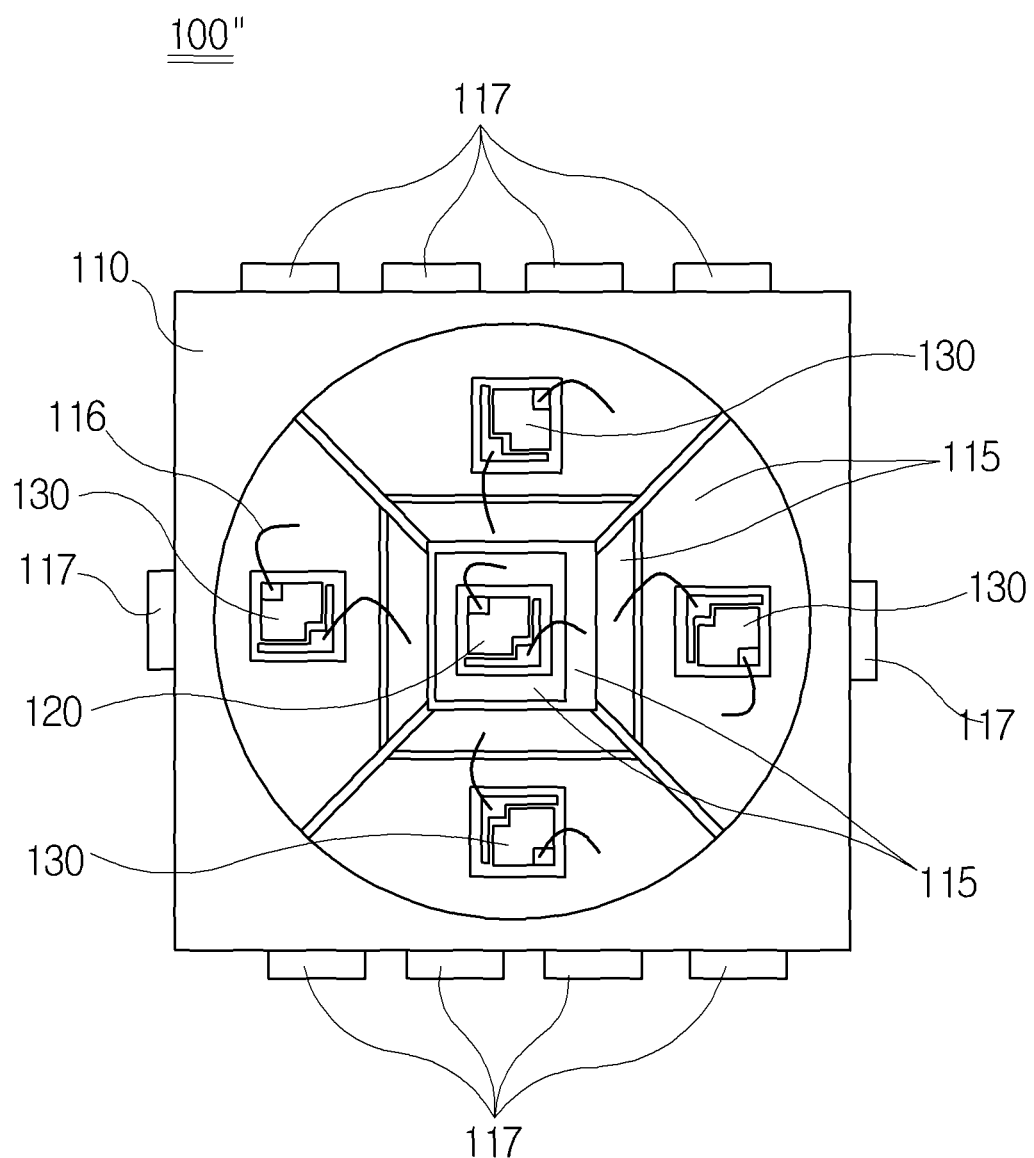
FIG. 13 is a plan view of the photo detection package shown in FIG. 12.

FIG. 12 is a cross-sectional view of the photo detection package in accordance with a fourth exemplary embodiment of the present invention, and FIG. 13 is a plan view of the photo detection package shown in FIG. 12.

The photo detection package 100" in accordance with the fourth exemplary embodiment of the present invention may include a package body 110 configured to have an upward opened groove unit 111 formed therein, a photo detection device 120 mounted on the bottom surface 112 of the groove unit 111 and electrically connected to the outside, and a Light-Emitting Diode (LED) 130 mounted on the inner surface of the groove unit 111 having an inclined surface on the periphery of the bottom surface 112 and electrically connected to the outside.

The package body 110 functions to support elements, such as the photo detection device 120 and the LED 130.

The upward opened groove unit 111 is formed in the package body 110. The bottom surface 112, that is, the lowest bottom surface of the groove unit 111, may have a flat surface. Furthermore, the inner surface of the groove unit 111 that is formed on the periphery of the bottom surface 112 is formed of an inclined surface.

The photo detection device 120 is mounted on the bottom surface 112 of the groove unit 111. The photo detection device 120 may be, for example, a UV photo detection device. The UV photo detection device may be fabricated by a Schottky type fabrication method using AlGaN, for example. The fabrication method is described in more detail with respect to the exemplary embodiments described above. Likewise, a GaN low-temperature buffer layer is grown on a sapphire substrate placed in a Metal Organic Vapor Phase Epitaxy (MOVPE) reaction chamber by supplying a Ga source and NH₃ gas at a temperature of about 550° C. Furthermore, a GaN high-temperature layer is grown by raising the temperature to about 1100° C. In order to prevent a crack, a high-temperature AlN layer is grown on the grown GaN high-temperature layer at a temperature of about 1100° C. An AlGaN layer is grown on the grown AlN layer as a light absorption layer. Metal, such as Ni, Pt, ITO, Pd, Au, or W, is deposited on the grown light absorption layer made of AlGaN so that the light absorption layer has a Schottky characteristic. Thereafter, the UV photo detection device can be fabricated by forming electrode layers.

The photo detection device and the method of fabricating the same are only examples. The photo detection device 120 of the present embodiment may be a variety of photo detection devices from which electric currents are generated by absorbed light.

The photo detection device 120 absorbs light, and thus an electric current flows through the photo detection device 120. The amount of light is measured by detecting the current signal.

Internal electrodes 115 may be formed in the bottom surface 112 of the groove unit 111 so that a current signal generated from the photo detection device 120 can be transferred externally. The photo detection device 120 may be connected to the internal electrodes 115 through bonding wires 116. Furthermore, the internal electrodes 115 may be electrically connected to external electrodes 117 formed in the package body 110 so that the internal electrodes 115 are exposed outside the package body 110.

The LED 130 is mounted on the inner surface of the groove unit 111 on the periphery of the bottom surface 112 on which the photo detection device 120 has been mounted. The LED 130 may be, for example, an Ultraviolet (UV) LED. In this case, UV light emitted from the UV LED may be used for sterilization, disinfection, and purification.

The LED 130 is not limited to an UV LED, but may be various LEDs having a light-emission function.

If the LED 130 is a UV LED, the photo detection device 120 may be a UV photo detection device in accordance with the UV LED. Furthermore, the photo detection package 100" includes the UV photo detection device and the UV LED, so the UV photo detection device can absorb UV emitted from the UV LED. Whether or not the UV photo detection device and the UV LED operate normally can be mutually checked through a monitoring process, as described in more detail below.

The LED 130 may be mounted on an inclined surface of the package body 110. In the present exemplary embodiment, the photo detection device 120 is mounted on the bottom surface 112. The inner surface of the groove unit 111, that is, the periphery of the bottom surface 112, may include a first inclined surface 113 on which the LED 130 is mounted. The reason why the LED 130 is mounted on the inclined surface as described above includes a proper arrangement structure within the groove unit 111. One of the grounds is to monitor whether or not the LED 130 normally operate in a relationship with the photo detection device 120.

The inner surface of the groove unit 111 may further include a second inclined surface 114. The second inclined surface 114 is an inner surface of the groove unit 111 which is formed on the outer side from the first inclined surface 113. If the first inclined surface 113 is formed to have a gentle slope, the second inclined surface 114 may have a greater tilt angle than the first inclined surface 113 by taking a light absorption direction toward the photo detection device 120, a light radiation direction from the LED 130, and the concentration of the amount of light into consideration.

The internal electrodes 115 may be formed in the inner surface of the groove unit 111 so that the LED 130 is electrically connected to the outside. The LED 130 and the internal electrodes 115 may be coupled by the bonding wires 116, and the internal electrode 115 to which the LED 130 is connected may be connected to an external electrode 117 formed in the package body 110.

The present exemplary embodiment may further include a package cover 140 combined with the package body 110 and configured to cover the opened top of the groove unit 111.

The package cover 140 can function to protect the aforementioned elements included in the groove unit 111 from an external environment. The package cover 140 may be formed of, for example, a quartz glass plate so that the absorption or dissipation of light is smooth. The package cover 140 may be combined with the package body 110 using various methods, such as a method of adhering the edge portion of the package cover 140 to the upper part of the groove unit 111.

The photo detection package 100" according to the present exemplary embodiment has multi-purposes, such as a photo detection function and a photo discharge function (e.g., for lighting for sterilization) due to the aforementioned structural characteristic. Furthermore, the photo detection package 100" may monitor whether or not the photo detection device 120 and the LED 130 operate normally. This is described in more detail below.

The photo detection device 120 measures the amount of light by absorbing external light. Here, it is necessary to check whether or not the photo detection device 120 operates normally, that is, whether or not the measured amount of light is accurate.

The photo detection package 100" according to the present exemplary embodiment can measure the amount of light radiated from the LED 130 mounted on the periphery of the photo detection device 120 before the photo detection device 120 measures the amount of external light and check whether or not the measurement value is within a predetermined normal range by comparing the measurement value with an initial input value. If, as a result of the comparison, the measurement value is found to be within the predetermined normal range, it may be determined that the photo detection device 120 operates normally, and a measurement value for the amount of external light measured by the photo detection device 120 may be reliable.

The LED 130 is mounted on the first inclined surface 113 included in the inner surface of the groove unit 111 as described above such that the photo detection device 120 can easily absorb light radiated from the LED 130, in other words, a sufficient amount of light from the LED 130 is directed toward the photo detection device 120. A tilt angle 'a' of the first inclined surface 113 exceeds 0° and may be 50° or less so that the LED 130 is easily mounted on the first inclined surface 113.

If the LED 130 does not operate normally, for example, the LED 130 emits an amount of light smaller than an initial amount of light, it may be determined that one of the photo detection device 120 and the LED 130 abnormally operates. In order to determine that which one of the photo detection device 120 and the LED 130 abnormally operates more accurately, the present exemplary embodiment may include a plurality of LEDs 130.

The plurality of LEDs 130 is mounted on the first inclined surfaces 113 included in the inner surface of the groove unit 111. As shown, the plurality of LEDs 130 may be spaced apart from one another at equal intervals on a concentric circle around the photo detection device 120 placed on the bottom surface 112. If the plurality of LEDs 130 is mounted on the first inclined surfaces 113, the plurality of LEDs 130 does not need to be necessarily spaced apart from one another at equal intervals, and the first inclined surfaces 113 included in the inner surface of the groove unit 111 do not need to be necessarily spaced apart from one another at equal intervals on the circumference on the periphery of the bottom surface 112.

According to the present exemplary embodiment, if the plurality of LEDs 130 is included as described above, whether or not the LEDs 130 and the photo detection device 120 operate normally can be checked more accurately.

More particularly, whether or not a specific LED 130 or a specific group of the LEDs 130 operates normally can be checked in such a manner that the plurality of LEDs 130 is sequentially driven one by one or two or more of possible combinations of the plurality of LEDs 130 are sequentially driven and the photo detection device 120 measures the amount of light radiated from the specific LED 130 or the two or more groups and compares the measured amount of light with an initial input value. Furthermore, if a measurement value for each LED 130 or a measurement value for each group is out of a normal range in relation to the initial input value, it may be determined that the photo detection device 120 abnormally operates.

Although not shown, the present exemplary embodiment may further include a signal processing unit for processing the measured light amount value, the comparison and determination of the measured light amount value and the initial input value, and corresponding processing.

Figure 14:
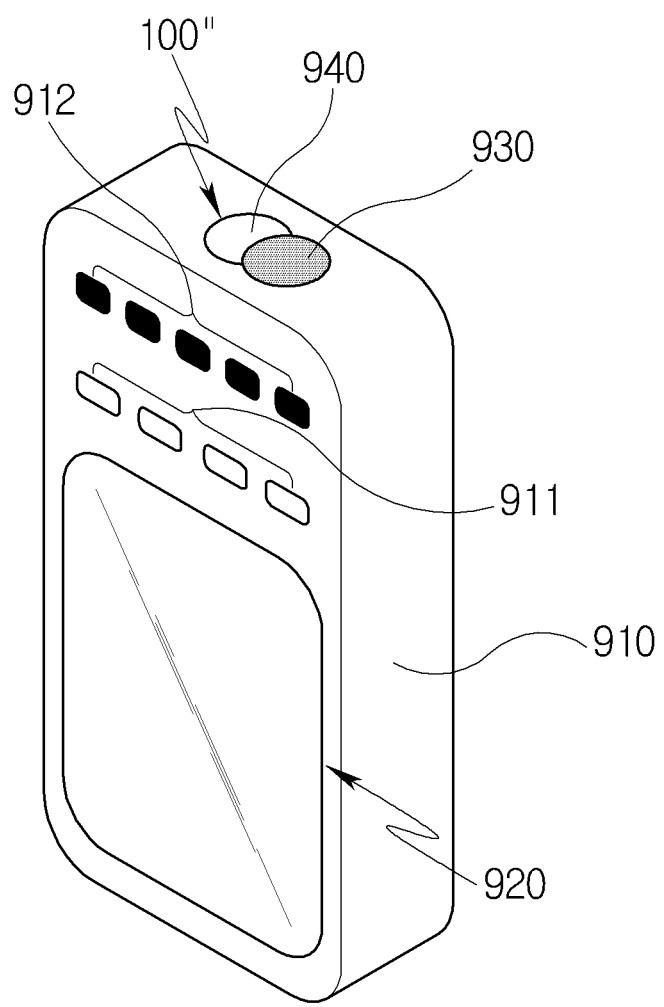
FIG. 14 is a perspective view of a portable device including the photo detection package in accordance with an exemplary embodiment of the present invention.

A portable device including the photo detection package in accordance with an exemplary embodiment of the present invention is described in detail below with reference to FIG. 14. A package included in the present exemplary embodiment may be the photo detection package 100, 100', or 100". In FIG. 14, the elements of the package included in the present exemplary embodiment are assigned the same reference numerals as those of the photo detection package 100" in accordance with the fourth exemplary embodiment, and a detailed description thereof is omitted.

FIG. 14 is a perspective view of a portable device including the photo detection package in accordance with an exemplary embodiment of the present invention.

The portable device 901 according to the present exemplary embodiment may include a main body unit 910, a package 100" mounted on the main body unit 910, and a display unit 920 formed in the main body unit 910 and configured to display information according to an operation of the photo detection device 120 or the LED 130.

The main body unit 910 functions to support elements disposed in the main body unit 910, such as the package 100" and the display unit 920. Although not shown, the signal processing unit may be embedded in the main body unit 910 and parts, such as a power supply unit, may be included in the main body unit 910.

As shown in FIG. 14, the main body unit 910 having a rectangular parallelepiped shape is illustrated, but the main body unit 910 is not limited to the rectangular parallelepiped shape. The main body unit 910 may have a variety of other shapes in which portable convenience has been taken into consideration.

The package 100" is mounted on the main body unit 910. For example, as shown in FIG. 14, the package 100" may be buried at the top of the main body unit 910. Although not shown, the package 100" may be mounted on various positions, such as the front surface, rear surface, left side, right side, or bottom surface of the main body unit 910 in such a way as to be buried or protruded.

The opened top direction of the groove unit 111 of the package 100", that is, a surface, in the direction in which light is absorbed or discharged, that is a portion on the package cover (140) side, is externally exposed in the state in which the package 100" has been mounted on the main body unit 910. The present exemplary embodiment may further include a main body unit cover 930 combined with the main body unit 910 and configured to open or close the exposed portion of the package 100".

The main body unit cover 930 can function to protect the package 100" from an external environment.

Furthermore, the main body unit cover 930 may participate in a mutual monitoring process between the photo detection device 120 and the LED 130 included in the package 100". A material layer (not shown) for performing total reflection on light may be formed in one surface of the main body unit cover 930 which faces a portion of the package 100" which is externally exposed. The material layer including, for example, Al materials may be coated on one surface of the main body unit cover 930 using various methods.

If the material layer is formed on one surface of the main body unit cover 930 as described above, light discharged from the LED 130 can be reflected from the material layer and easily directed toward the photo detection device 120. Accordingly, although the first inclined surface 113 on which the LED 130 is mounted has a gentle inclined surface in which the ease of assembly is taken into consideration, the photo detection device 120 can absorb a sufficient amount of light that is necessary for measurement through the reflection of light in the material layer.

The display unit 920 functions to externally display information according to an operation of the package 100", that is, information according to an operation of the photo detection device 120 or the LED 130.

More particularly, the signal processing unit can obtain information about the amount of light, for example, UV information, such as a UV index, by converting an analog signal received from the photo detection device 120 into a digital signal. Such information can be displayed on the display unit 920. Here, supplementary information corresponding to information about the amount of light may also be displayed. For example, if a UV index is displayed, information, such as a warning or measures corresponding to the UV index, may also be displayed.

Furthermore, if the LED 130 is an UV LED, for example, and sterilization, purification, or disinfection using the LED 130 is performed, information about contents that call attention so that the a user's body is not exposed to UV emitted from the UV LED or an operation time may be displayed on the display unit 920.

In addition to the information according to the natural functions of the photo detection device 120 and the LED 130, information about a result of monitoring regarding whether or not the photo detection device 120 and the LED 130 operate normally may also be displayed on the display unit 920.

The present exemplary embodiment may further include a function button unit 911 formed in the main body unit 910. The function button unit 911 may be configured to perform specific functions in relation to the package 100" or the display unit 920. For example, the function button unit 911 may include a reset button and a power ON/OFF button. The portable device 901 according to the present exemplary embodiment may have improved convenience according to the function button unit 911.

The present exemplary embodiment may further include a color display unit 912 formed in the main body unit 910 so that a user can easily check information about the amount of light. If the photo detection device 120 is, for example, a UV photo detection device, the color display unit 912 may display a specific color in response to UV information detected by the photo detection device 120. The specific color may be, for example, green, yellow, orange, red, and purple according to the 5-step classification of an UV index. The color display unit 912 may be formed of one color display unit for displaying a specific color or may be formed of a plurality of color display units for displaying respective colors as shown in FIG. 14.

A portable device including the photo detection package in accordance with another exemplary embodiment of the present invention is described below with reference to the accompanying drawings. A portable device 902 of the present exemplary embodiment differs from the portable device 901 of the previous exemplary embodiment in some elements, and only a difference between the present exemplary embodiment and the previous exemplary embodiment is described in detail.

Figure 15:
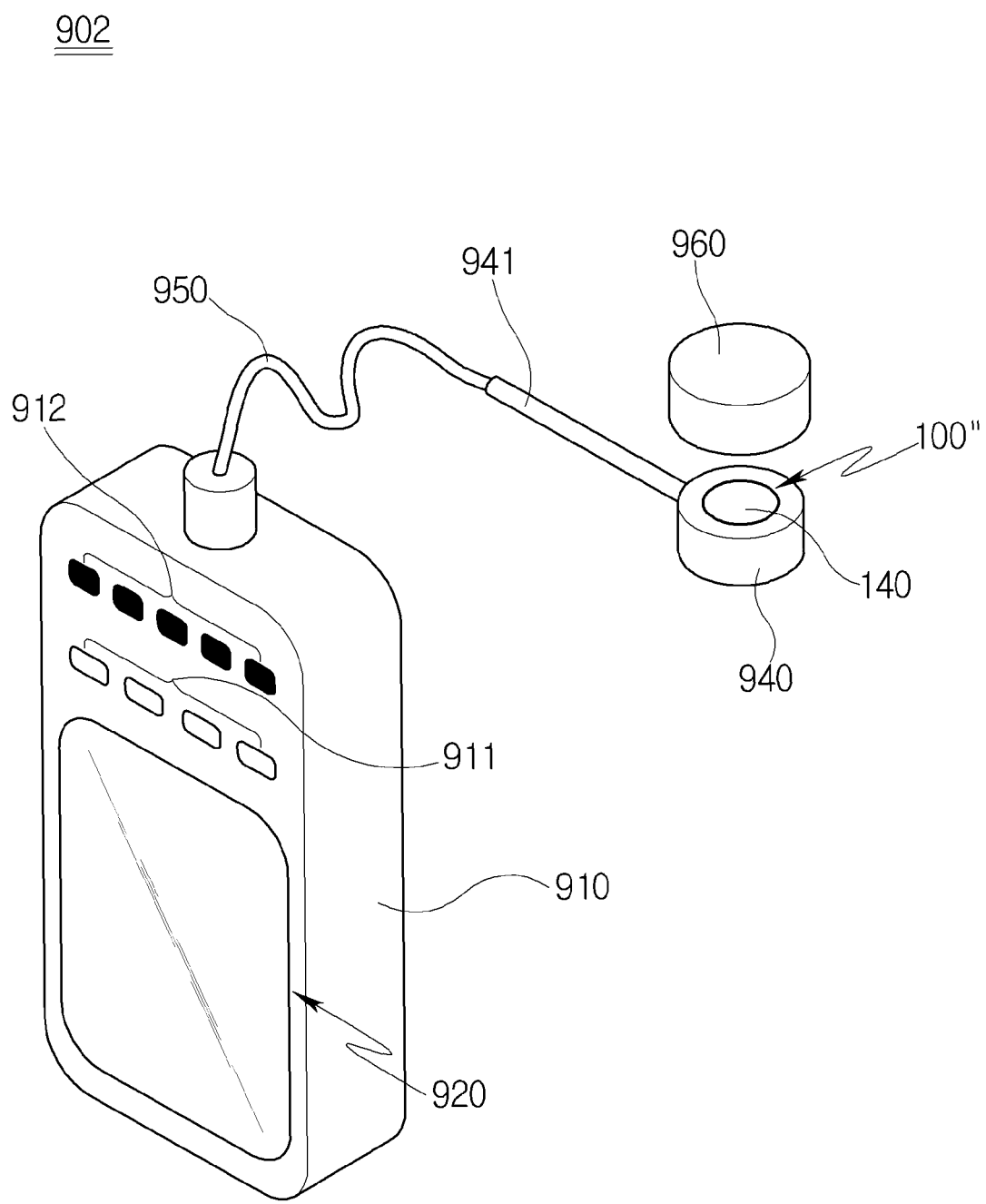
FIG. 15 is a perspective view of a portable device including the photo detection package in accordance with an exemplary embodiment of the present invention.

FIG. 15 is a perspective view of a portable device including the photo detection package in accordance with another exemplary embodiment of the present invention.

The portable device 902 according to the present exemplary embodiment may include a main body unit 910, a mounting unit 940 configured to have the package 100" mounted thereon, a signal transfer line 950 extended from the mounting unit 940, connected to the main body unit 910, and configured to electrically connect the package 100" and the main body unit 910, and a display unit 920 formed in the main body unit 910 and configured to display information according to an operation of the photo detection device 120 or the LED 130.

The portable device 902 according to the present exemplary embodiment is different from the portable device 901 according to the aforementioned exemplary embodiment in that the package 100" is not directly mounted on the main body unit 910, but is mounted on the additional mounting unit 940.

The mounting unit 940 functions to support the package 100" mounted thereon. The package cover 140 of the package 100" mounted on the mounting unit 940 is externally exposed. The present exemplary embodiment may further include a mounting unit cover 960 combined with the mounting unit 940 and configured to open or close a portion of the package 100" which is externally exposed.

The mounting unit cover 960 performs the same function as the main body unit cover 930. A material layer (not shown) having the same function as the aforementioned material layer and including the same materials as those of the aforementioned material layer may be formed in one surface of the mounting unit cover 960 which faces the externally exposed portion of the package 100".

A handle unit 941 may be formed on one side of the mounting unit 940 by taking use convenience into consideration. For example, the handle unit 941 protruded from the side of the mounting unit 940 may be formed as shown in FIG. 15, and a user can easily place the mounting unit 940 at a desired position or in a desired direction using the handle unit 941. Furthermore, if UV light is to be measured, a body part, such as a hand, can be placed far from a measurement position using the handle unit, thereby being capable of reducing a danger that the body is exposed to the UV light.

The present exemplary embodiment includes the signal transfer line 950 for electrically connecting the package 100" and the main body unit 910 because the package 100" is mounted on the additional mounting unit 940.

The signal transfer line 950 may be electrically connected to the external electrodes 117 (refer to FIG. 12) of the package 100" and is extended from the mounting unit 940 and connected to the main body unit 910.

A signal processing unit (not shown) that may be included in the main body unit 910 processes signals received through the signal transfer line 950. Furthermore, a power supply unit that may be included in the main body unit 910 can supply power to the package 100" through the signal transfer line 950.

In accordance with the exemplary embodiments of the present invention, different wavelength regions of two or more regions can be detected in one device because the first electrode layer is formed in each of the plurality of light absorption layers capable of detecting different wavelength regions and the plurality of light absorption layers can operate individually.

Furthermore, reliability of a product can be improved because an accurate reactivity value according to a wavelength can be obtained without increasing a reverse bias value.

Furthermore, a photo detection package having both a light detection function and a light dissipation function and capable of realizing a simple structure if both a photo detection device and an LED are included in one package and a portable device including the photo detection package are provided.

Furthermore, whether or not a photo detection device and an LED operate normally can be monitored mutually because a photo detection package is configured to include the photo detection device capable of absorbing light emitted from the LED, and thus reliability of a product can be secured.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photo detection device, comprising:
a substrate;
a first light absorption layer disposed on the substrate;
a second light absorption layer disposed in a first region on the first light absorption layer;
a first electrode layer disposed on each of the first and the second light absorption layers; and
a second electrode layer disposed on the first light absorption layer and spaced apart from the first electrode layer, or disposed on a second surface of the substrate so that the first and second light absorption layers are disposed on a first surface of the substrate opposite to the second surface.

2. The photo detection device of claim 1, further comprising a third light absorption layer disposed in a second region on the second light absorption layer, wherein the first, the second, and the third light absorption layers comprise different energy bandgaps.

3. The photo detection device of claim 1, further comprising a buffer layer disposed between the substrate and the first light absorption layer.

4. The photo detection device of claim 2, wherein:
a first Schottky layer is disposed on the first light absorption layer and spaced apart from the second light absorption layer,
a second Schottky layer is disposed on the second light absorption layer and spaced apart from the third light absorption layer, and
a third Schottky layer is disposed in a third region on the third light absorption layer.

5. The photo detection device of claim 4, wherein the first electrode layer is disposed on each of the first, the second, and the third Schottky layers.

6. The photo detection device of claim 2, further comprising a first strain reduction layer disposed between the second light absorption layer and the third light absorption layer.

7. The photo detection device of claim 6, further comprising a second strain reduction layer disposed between the first light absorption layer and the second light absorption layer.

8. The photo detection device of claim 3, wherein:
the buffer layer comprises a low-temperature GaN layer, and
the first light absorption layer comprises a high-temperature GaN layer.

9. The photo detection device of claim 2, wherein:
the second light absorption layer comprises $Al_xGa_{1-x}N$ ($0<x<1$),
the third light absorption layer comprises $Al_yGa_{1-y}N$ ($0<y<1$), and
the second light absorption layer comprises a different Al composition from the third light absorption layer.

10. The photo detection device of claim 2, wherein each of the first light absorption layer, the second light absorption layer, and the third light absorption layer comprises an $Al_xGa_{1-x}N$ ($0<x<y$) layer, an $Al_yGa_{1-y}N$ ($x<y<1$) layer, or an $In_zGa_{1-z}N$ ($0<z<1$) layer so that the $Al_xGa_{1-x}N$ ($0<x<y$) layer, the $Al_yGa_{1-y}N$ ($x<y<1$) layer, or the $In_zGa_{1-z}N$ ($0<z<1$) layer included in any one of the first, the second, and the third absorption layers is not included in remaining absorption layers.

11. The photo detection device of claim 4, wherein the first, the second, and the third Schottky layers each comprise one selected from the group consisting of ITO, Pt, W, Ti, Pd, Ru, Cr, Au, Ni, and Cr.

12. The photo detection device of claim 7, wherein:
the first strain reduction layer comprises $Al_dIn_{1-d}N$ ($0<d\leq1$), and
the second strain reduction layer comprises $Al_fIn_{1-f}N$ ($0<f\leq1$).

13. A photo detection package, comprising:
a lead frame comprising a depression unit disposed in a top surface of the lead frame;
a photo detection device disposed on the depression unit, the photo detection device comprising a plurality of light absorption layers comprising different energy bandgaps and first electrode layers disposed on the respective light absorption layers; and
a plurality of first electrode plates spaced apart from one another and disposed on a first side of a bottom surface of the depression unit, the first electrode plates being electrically connected to respective first electrode layers by bonding wires.

14. The photo detection package of claim 13, further comprising a second electrode layer spaced apart from the first electrode layers, wherein a light absorption layer of the plurality of light absorption layers is disposed on the second electrode layer; and
a second electrode plate disposed on a second side of the bottom surface of the depression unit, the second electrode plate being electrically connected to the second electrode layer by a bonding wire.

15. The photo detection package of claim 14, further comprising a device contact plate spaced apart from and disposed between the first electrode plates and the second electrode plate, wherein the photo detection device is disposed on the device contact plate.

16. The photo detection package of claim 13, further comprising a second electrode layer, wherein the photo detection device is disposed on the second electrode layer.

17. The photo detection package of claim 16, further comprising a second electrode plate spaced apart from the first electrode plates and disposed on a second side of the bottom surface of the depression unit, wherein the photo detection device is disposed on the second electrode plate.

18. The photo detection package of claim 14, further comprising a plurality of first lead wires electrically connected to respective first electrode plates and disposed on a first side of the lead frame; and
a second lead wire electrically connected to the second electrode plate and disposed on a second side of the lead frame.

19. The photo detection package of claim 17, further comprising a plurality of first lead wires electrically connected to respective first electrode plates and disposed on a first side of the lead frame, and
a second lead wire electrically connected to the second electrode plate and disposed on a second side of the lead frame.

20. The photo detection package of claim 13, wherein the photo detection device comprises:
a substrate;
a first light absorption layer disposed on the substrate;
a second light absorption layer disposed in a first region on the first light absorption layer;
a third light absorption layer disposed in a second region on the second light absorption layer; and
a first electrode layer disposed on each of the first, the second, and the third light absorption layers.

21. The photo detection package of claim 20, further comprising:
a first Schottky layer disposed on the first light absorption layer and spaced apart from the second light absorption layer,
a second Schottky layer disposed on the second light absorption layer and spaced apart from the third light absorption layer, and
a third Schottky layer disposed in a third region on the third light absorption layer.

22. The photo detection package of claim 21, wherein the first electrode layer is disposed on each of the first, the second, and the third Schottky layers.

23. The photo detection package of claim 20, further comprising a buffer layer disposed between the substrate and the first light absorption layer.

24. The photo detection package of claim 20, further comprising a first strain reduction layer disposed between the second light absorption layer and the third light absorption layer.

25. The photo detection package of claim 24, further comprising a second strain reduction layer disposed between the first light absorption layer and the second light absorption layer.

* * * * *